(12) United States Patent
Kim et al.

(10) Patent No.: US 8,587,991 B2
(45) Date of Patent: *Nov. 19, 2013

(54) RECYCLING CHARGES

(75) Inventors: Young Seog Kim, Pleasanton, CA (US);
Kuoyuan (Peter) Hsu, San Jose, CA (US); Derek C. Tao, Fremont, CA (US); Young Suk Kim, Fremont, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/429,082

(22) Filed: Mar. 23, 2012

(65) Prior Publication Data

US 2012/0182819 A1    Jul. 19, 2012

Related U.S. Application Data

(63) Continuation of application No. 12/843,366, filed on Jul. 26, 2010, now Pat. No. 8,159,862.

(51) Int. Cl.
   *G11C 11/00*    (2006.01)
   *G11C 7/00*    (2006.01)
   *G11C 5/14*    (2006.01)

(52) U.S. Cl.
   USPC .. 365/154; 365/156; 365/189.09; 365/189.11; 365/226; 365/227

(58) Field of Classification Search
   USPC ........ 365/154, 156, 189.09, 189.11, 226, 227
   See application file for complete search history.

(56) References Cited

U.S. PATENT DOCUMENTS

| | | | |
|---|---|---|---|
| 5,179,299 | A | 1/1993 | Tipon |
| 5,585,747 | A | 12/1996 | Proebsting |
| 5,715,191 | A | 2/1998 | Yamauchi et al. |
| 6,046,944 | A | 4/2000 | Singh |
| 6,307,805 | B1 | 10/2001 | Andersen et al. |
| 6,424,585 | B1 | 7/2002 | Ooishi |
| 6,549,453 | B2 | 4/2003 | Wong |
| 7,408,827 | B1 | 8/2008 | Peng et al. |
| 7,457,143 | B2 | 11/2008 | Lehmann et al. |
| 7,679,948 | B2 | 3/2010 | Park et al. |
| 7,894,285 | B2 | 2/2011 | Ma et al. |
| 7,911,855 | B2 | 3/2011 | Tada |
| 7,924,650 | B2 | 4/2011 | Cho et al. |

FOREIGN PATENT DOCUMENTS

CN    101355299    1/2009

OTHER PUBLICATIONS

Office Action dated Jan. 21, 2013 from corresponding application No. CN 201010563358.7.

*Primary Examiner* — Trong Phan

(74) *Attorney, Agent, or Firm* — Lowe Hauptman & Ham, LLP

(57) ABSTRACT

A circuit includes a first node; a second node; a first PMOS transistor having a source coupled to the first node, a drain coupled to a first control transistor, and a gate driven by a first voltage; and a first NMOS transistor having a source coupled to the second node, a drain coupled to the first control transistor, and a gate driven by a second voltage. The first PMOS transistor is configured to automatically turn off based on the first voltage and a first node voltage at the first node. The first NMOS transistor is configured to automatically turn off based on the second voltage and a second node voltage at the second node. When the first PMOS transistor, the control transistor, and the first NMOS transistor are on, the first node voltage is lowered while the second voltage is raised.

20 Claims, 3 Drawing Sheets

RECYCLING CHARGES

CROSS-REFERENCE TO RELATED APPLICATION

The present application is a continuation of U.S. patent application Ser. No. 12/843,366, filed Jul. 26, 2010, which is incorporated herein by reference in its entirety.

FILED

The present disclosure is related to recycling charges in integrated circuits.

BACKGROUND

In static random access memory (SRAM), for a faster read access time in a read mode, the internal ground node of the memory cell in some approaches is set at the conventional ground or voltage VSS, and the internal supply node is set at the conventional operation voltage VDD. In a data retention mode (e.g., after a reading mode), to reduce current leakages, either the internal ground node is raised by a voltage, e.g., voltage Vred, or the internal supply node is lowered, e.g., by voltage Vred. In some approaches that use a self-bias diode, raising the internal ground node from voltage VSS by voltage Vred depends on the current driving capabilities of the memory cell and can take a long time, which negates the advantages of the power saved in the data retention scheme. To fix the problem, an extra circuit (e.g., a large driver) can be used to quickly pull up voltage VSS, but requires additional power (e.g., a large current) and generates a large amount of noise.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
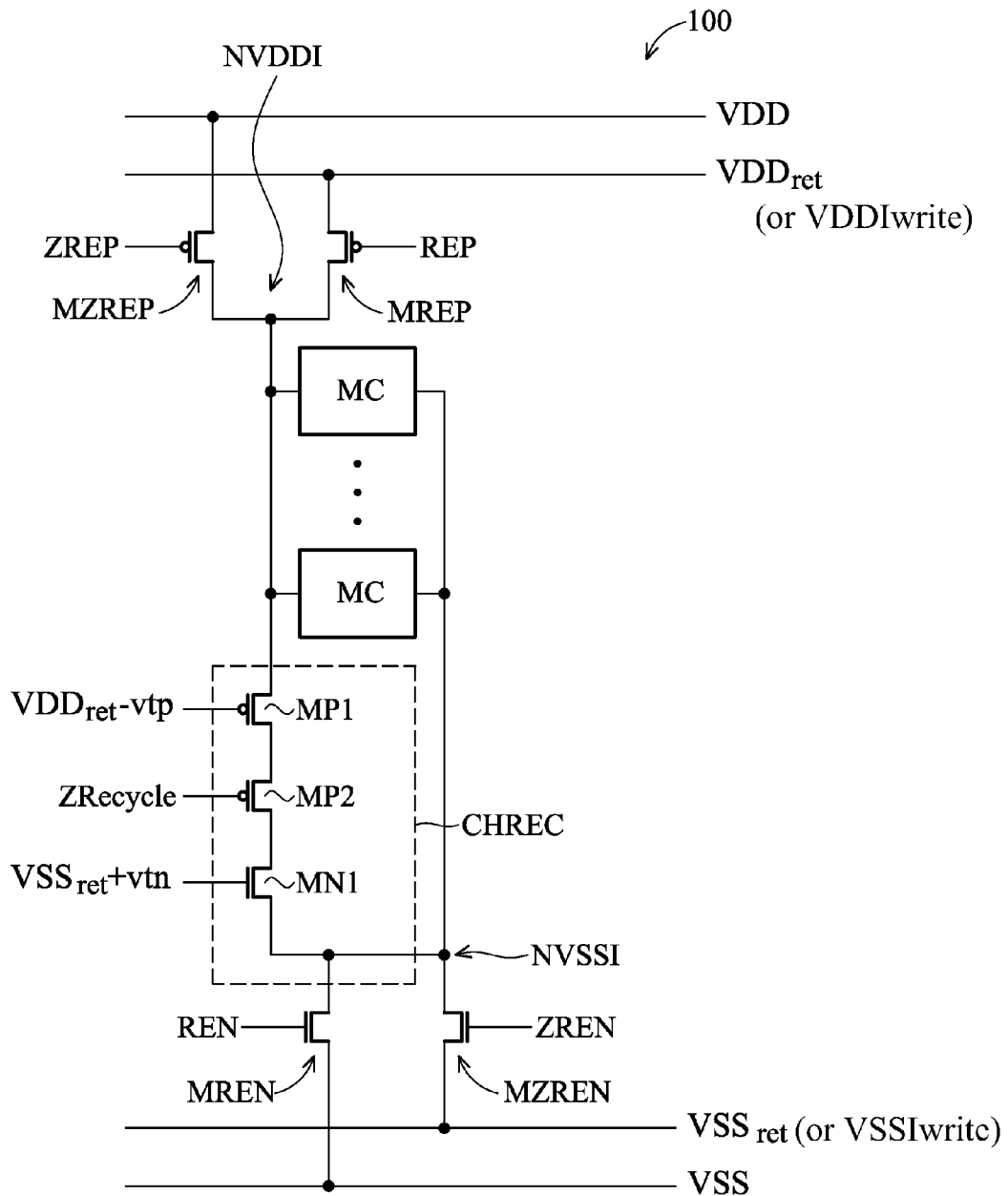
FIG. 1 is an exemplary circuit, in accordance with some embodiments.

Embodiments, or examples, illustrated in the drawings are now disclosed using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. The quick falling time from operation voltage VDD to the internal supply voltage VDDI and the quick rising time from voltage VSS to internal ground voltage VSSI reduces power while the lowered internal supply voltage and the raised internal ground voltage provide full advantages of the saved power due to less current leakage. Charge recycling of voltage VDDI to voltage VSSI enables additional power reduction. Undershooting and overshooting of the respective nodes of voltage VDDI and VSSI are prevented. Noise is reduced based on reducing the voltage swing between the internal supply node and the internal ground node.

Exemplary Circuit

FIG. 1 is a diagram of a circuit 100 in accordance with some embodiments. Circuit 100 represents a column of a memory array of memory cells MC (e.g., SRAM cells) arranged in columns and rows.

Figure 2:
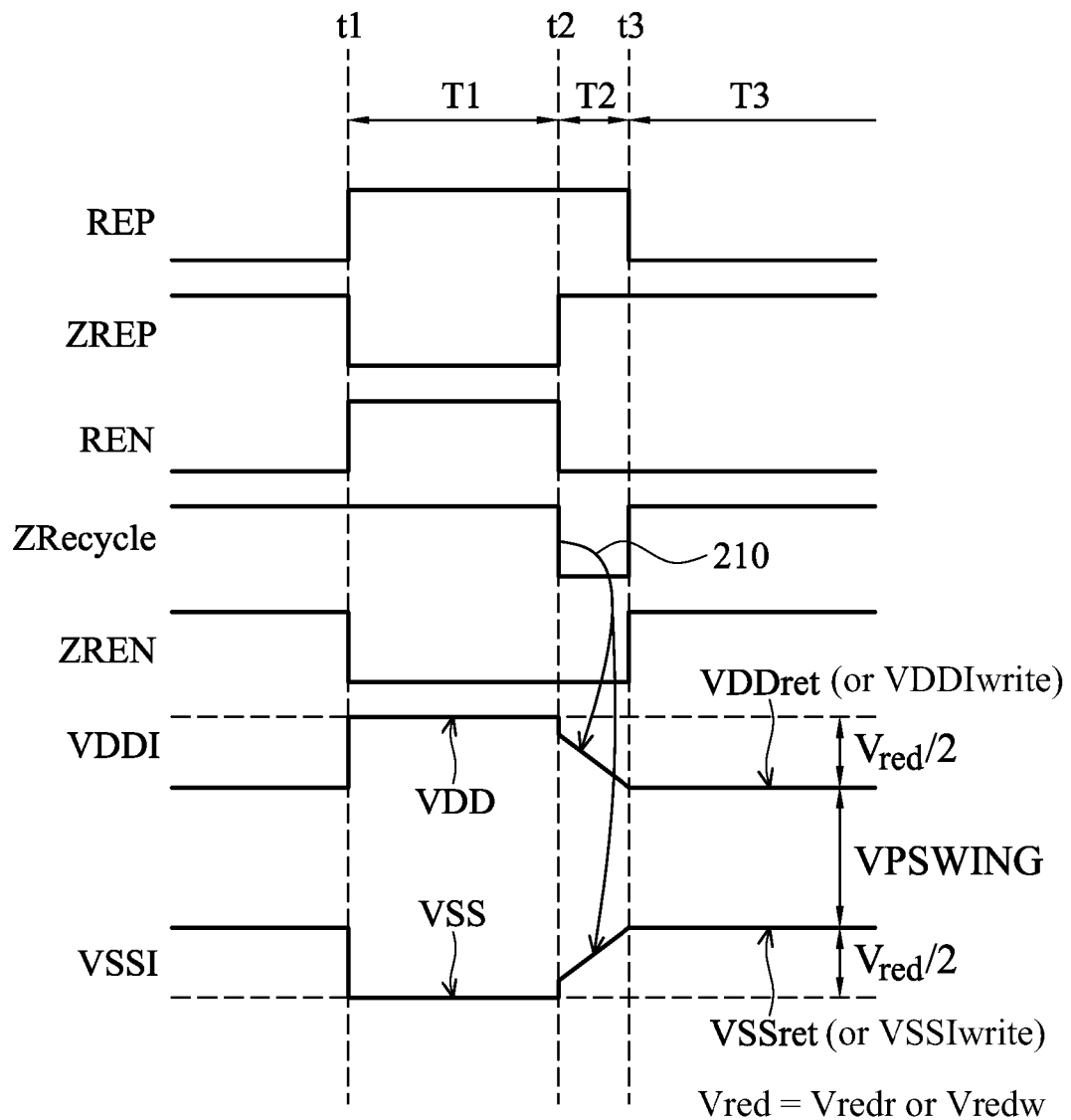
FIG. 2 is a graph of waveforms illustrating an operation of the circuit in FIG. 1, in accordance with some embodiments.

Node NVDDI is called the internal power supply node of circuit (or column) 100. In some embodiments, memory cells MC in column 100 use the voltage (e.g., voltage VDDI, not labeled) at the internal power supply node NVDDI as the operational voltage. Node NVSSI is called the internal ground node of column 100. In some embodiments, memory cells MC in column 100 use the voltage (e.g., voltage VSSI, not labeled) at node NVSSI as a ground reference for the operational voltage VDDI. The supply voltage swing (e.g., voltage VPSWING, as shown in FIG. 2) is the voltage difference between voltage VDDI and voltage VSSI. The voltages VDDI and VSSI at nodes NVDDI and NVSSI are set according to the desired supply power for memory cells MC in column 100. As a result, voltage VPSWING depends on one or a combination of voltage VDDI and voltage VSSI. Voltage VPSWING, and thus the combination of voltages VDDI and VSSI, is set depending on applications. For example, in some embodiments, to enable easier writing to a memory cell MC, voltage VPSWING is set to a smaller value. For a further example, voltage VDDI is set at voltage VDDIwrite and/or voltage VSSI is set at voltage VSSIwrite wherein the combination of voltage VDDIwrite and voltage VSSIwrite provides the voltage swing sufficient to write data to a memory cell MC. To reduce leakage currents (e.g., in un-accessed memory cells), and/or in a data retention mode, voltage VDDI is set to voltage VDDret and/or voltage VSSI is set to voltage VSSret wherein voltages VDDret and VSSret provide the voltage swing sufficient for a memory cell to retain the stored data. In some embodiments, voltage VDDIwrite is lower than voltage VDD but higher than voltage VDDret and voltage VSSIwrite is higher than voltage VSS but lower than voltage VSSret. In a (data) retention mode, voltage VPSWING is set to a value sufficient to retain the data stored in the memory cells. In some situations, to avoid the risk of corrupting the data stored in the memory cells, voltage VPSWING is set to a larger value. For example, voltage VDDI is set to voltage VDD and/or voltage VSSI is set to voltage VSS. In some embodiments, when voltage VPSWING is reduced by a voltage, e.g., voltage Vred, voltage VDDI is lowered by ½ Vred and voltage VSSI is raised by ½ Vred. For example, in a data retention mode, voltage swing VPSWING is reduced by voltage Vredr, voltage VDDI is lowered by ½ voltage Vredr, e.g., to voltage VDDret, while voltage VSSI is raised by ½ Vredr, e.g., to voltage VSSret. For another example, in a write mode, voltage swing VPSWING is reduced by voltage Vredw, voltage VDDI is lowered by ½ Vredw, e.g., to voltage VDDIwrite, and voltage VSSI is raised by ½ Vredw, e.g., to voltage VSSIwrite. Additionally, in some embodiments, the charges from lowering voltage VDDI are used in raising voltage VSSI.

PMOS transistors MZREP and MREP provide the respective voltage VDD or voltage VDDret to node NVDDI. For example, when transistor MZREP is on, voltage VDD is passed to node NVDDI, but when transistor MREP is on, voltage VDDret is passed to node NVDDI. Signals ZREP and REP at the gates of respective transistors MZREP and MREP control (e.g., turn on/off) the respective transistors MZREP and MREP. For example, when signal ZREP or REP is driven by a low logic level (e.g., a Low), signal ZREP or signal REP turns on the respective transistor MZREP or MREP, but when signal ZREP or signal REP is driven by a high logic level (e.g., a High), signal ZREP or REP turns off the respective transistor MZREP or MREP.

Similarly, NMOS transistors MZREN and MREN provide the respective voltage VSS or voltage VSSret to node NVSSI. For example, when transistor MZREN is on, voltage VSS is passed to node NVSSI, but when transistor MREN is on, voltage VSSret is passed to node NVSSI. Signals ZREN and REN at the gates of respective transistors MZREN and MREN control (e.g., turn on/off) the respective transistors MZREN and MREN. For example, when signal ZREN or signal REN is driven High, signal NZREN or signal NREN turns on the respective transistor NZREN or transistor NREN, but when signal ZREN or signal REN is driven Low, signal ZREN or signal REN turns off the respective transistor MZREN or transistor MREN.

Charge recycling circuit CHREC comprises transistors MP1, MP2, and MN1. PMOS transistor MP1 limits voltage VDDI to not lower than voltage VDDret. In some embodiments, voltage VGMP1 (not labeled), the voltage at the gate of transistor MP1 is set at VDDret minus Vtp, wherein voltage Vtp is the threshold voltage of transistor MP1. As a result, voltage VGSMP1, the voltage drop across the gate and the source of transistor MP1 is VDDret minus Vtp minus VDDI, because voltage VDDI is the voltage at the source of transistor MP1. When voltage VDDI reaches (e.g., is a little lower than) voltage VDDret, voltage VDDret minus VDDI is less than zero, and voltage VGSMP1 is a little lower than voltage Vtp, which turns off transistor MP1. Stated differently, when voltage VDDI reaches voltage VDDret, transistor MP1 is turned off or voltage VDDI is limited to voltage VDDret.

NMOS transistor MN1 limits voltage VSSI to not higher than voltage VSSret. In some embodiments, voltage VGMN1 (not labeled), the voltage at the gate of transistor MN1, is set at VSSret plus Vtn, wherein voltage Vtn is the threshold voltage of transistor MN1. As a result, voltage VGSMN1, the voltage drop across the gate and the source of transistor MN1, is VSSret plus Vtn minus VSSI, because voltage VSSI is the voltage at the source of transistor MN1. When voltage VSSI reaches (e.g., is a little higher than) voltage VSSret, voltage VSSret minus VSSI is greater than zero, and voltage VGSMN1 is a little less than voltage Vtn, which turns off transistor MN1. Stated differently, when voltage VSSI reaches voltage VSSret, transistor MN1 is turned off or voltage VSSI is limited to voltage VSSret.

In the above illustration, voltages VDDI minus Vtp and VSSI plus Vtn are applied at the gates of respective transistors MP1 and MN1 to automatically limit the respective voltages VDDI and VSSI to voltages VDDret and VSSret. In some other embodiments, a timing mechanism is used to turn off transistors MP1 and MN1 when voltage VDDI and/or voltage VSSI reaches the limiting voltage VDDret and/or VSSret, respectively.

Transistor MP2 serves as a pass gate to transfer the charge from node NVDDI to node NVSSI. Signal ZRecycle applied at the gate of transistor MP2 controls transistor MP2. For example, when signal ZRecycle is driven High, it turns off transistor MP2, but when signal ZRecycle is driven Low, it turns on transistor MP2. Transistor MP2 is shown as a PMOS for illustration, but in some further embodiments, transistor MP2 is NMOS.

In some embodiments, each column 100 includes a charge recycling circuit CHREC. In some further embodiments, a circuit CHREC is shared among a plurality of columns or all columns in a memory array. Using one circuit CHREC for a column, a plurality of columns, or all columns in a memory array is a design choice taking into consideration the ability to control each column, the semiconductor layout spaces, etc.

In FIG. 1, voltage VDDret and voltage VSSret are shown for illustration indicating the respective voltages at the data retention mode, but the disclosed embodiments are not limited to such a mode. Voltages VDDret and/or VSSret are set at any desired value. For example, when a memory cell MC is in the write mode, voltage VDDI and VSSI are set accordingly, e.g., to voltages VDDIwrite and VSSIwrite, respectively.

Exemplary Waveforms

FIG. 2 is a graph of waveforms illustrating an operation of circuit 100, in accordance with some embodiments. In some embodiments, when voltage VPSWING is reduced, e.g., by voltage Vred, the total swing reduction is divided into a first half for voltage VDD and a second half for voltage VSS. That is, voltage VDDI is lowered by ½ Vred, and voltage VSSI is raised by ½ Vred. Further, the charge of voltage VDDI when being lowered is used to raise voltage VSSI. In this illustration, a memory cell MC is first in a read mode in the time period T1. Memory cell MC then transitions to the charge recycling mode in time period T2, then to the data retention mode in time period T3.

At time t1, memory cell MC is configured to be in a read mode wherein voltage VPSWING is at the full swing from voltage VSS to voltage VDD. Signals ZREP and REN are driven Low and High, respectively, which turn on the respective transistors MZREP and MREN. As a result, nodes NVDDI and NVSSI are electrically coupled to the respective voltages VDD and VSS, resulting in the full swing VSS-VDD. At the same time, signal ZRecycle is driven High to turn off transistor MP2, and signals REP and ZREN are driven High and Low, respectively, to turn off the respective transistors MREP and MZREN.

At time t2, after the read mode, memory cell MC is configured to be in a charge recycling mode during time period T2 such that voltage VPSWING is eventually reduced by voltage Vred. In some embodiments, voltage VDDI is lowered by ½ Vred and voltage VSSI is raised by ½ Vred as shown in time period T3. Signals ZREP and REN are driven High and Low, respectively, to turn off transistors ZREP and REN. At this time, nodes NVDDI and NVSSI are at the respective voltages VDD and VSS. Signal ZRecycle is then driven Low to turn on transistor MP2 and thus charge recycling circuit CHREC, which triggers the charge recycling mode as illustrated by line 210. In some embodiments, because the gate of transistors MP1 and MN1 are driven by the respective voltages VDDret minus Vtp and VSSret plus Vtn, transistors MP1 and MN1 are turned on. Because transistors MP1, MP2, and MN1 are turned on, they are considered as a short circuit. Consequently, the voltage at the source of transistor MN1 or node NVSSI and the voltage at the source of transistor MP1 or node NVDDI move closer to each other. Stated another way, voltage VDDI supplied by voltage VDD, that is the voltage at node NVDDI, is lowered while voltage VSSI supplied by voltage VSS, that is the voltage at node NVSSI, is raised. Further, the charge of the lowered voltage VDDI is used or recycled in raising voltage VSSI.

In some embodiments, when voltage VDDI is lowered by about ½ Vred to voltage VDDret and voltage VSSI is raised by about ½ Vred to voltage VSSret, which is at time t3, signal ZRecycle is deactivated (e.g., driven High) to turn off transistor MP2. At the same time, signals REP and ZREN are driven Low and High, respectively, to turn on transistors MREP and MZREN so that nodes VDDI and VSSI are electrically connected to the respective voltages VDDret and VSSret. The time period T2 or the charge recycling time is calculated based on various factors including the capacitance at nodes VDDI and VSSI, the driving capabilities (and thus the sizes) of transistors MP1, MP2, and MN1, taking into consideration the effect of process, voltage, and temperature (PVT) variations. In some embodiments, the time period T2 is determined using simulation given a particular set of designed transistors MP1, MP2, and MN2, and the time it takes for voltages VDDI and VSSI to be respectively lowered and raised by ½ Vred. In some embodiments, charge recycling period T2 is less than 1 nS, and is very small compared to the read period T1 and/or the retention period T3. In some embodiments, even if time t3 has not been reached, transistor MP2 has not been turned on, and if voltage VDDI has been lowered by ½ Vred and/or voltage VSSI has been raised by ½ Vred, circuit CHREC is turned off because one or a combination of transistors MP1 and MN1 is turned off.

In some embodiments, the rate at which voltage VDDI is lowered and at which voltage VDDI is raised depends on the capacitance at the respective nodes NVDDI and NVSSI. In some embodiments, the capacitance at node NVDDI is about (e.g., substantially equal to) the capacitance at node NVSSI, and, as a result, the rate at which voltage VDDI is lowered is substantially the same as the rate at which voltage VSSI is raised. Consequently, voltage VDDI reaches voltage VDDret or voltage VDDIwrite at about the same time as voltage VSSI reaches voltage VSSret or voltage VSSIwrite, respectively.

In the above illustration, during time period T3, memory cell MC is in the retention mode, voltage VPSWING is reduced by voltage Vred wherein voltage VDDI is lowered by ½ Vred to voltage VDDret, and voltage VSSI is raised by ½ Vred to voltage VSSret.

When the memory cell MC is in the read mode again, i.e., voltages VDDI and VSSI are respectively lowered and raised to voltages VDD and VSS, the operation of memory cell MC is the same as illustrated above with reference to time t1. Further, the operation between the read mode (e.g., time period T1) and retention mode (e.g., time period T3) is used for illustration, embodiments of the disclosure are not so limited, but are applicable when voltages VDDI and VSSI are lowered and raised, respectively. For example, in some embodiments, in a write cycle, voltages VDDI and voltage VSSI are lowered and raised to voltages VDDIwrite and VSSIwrite, respectively, principles of the disclosed embodiments illustrated above are used accordingly.

Exemplary Method

Figure 3:
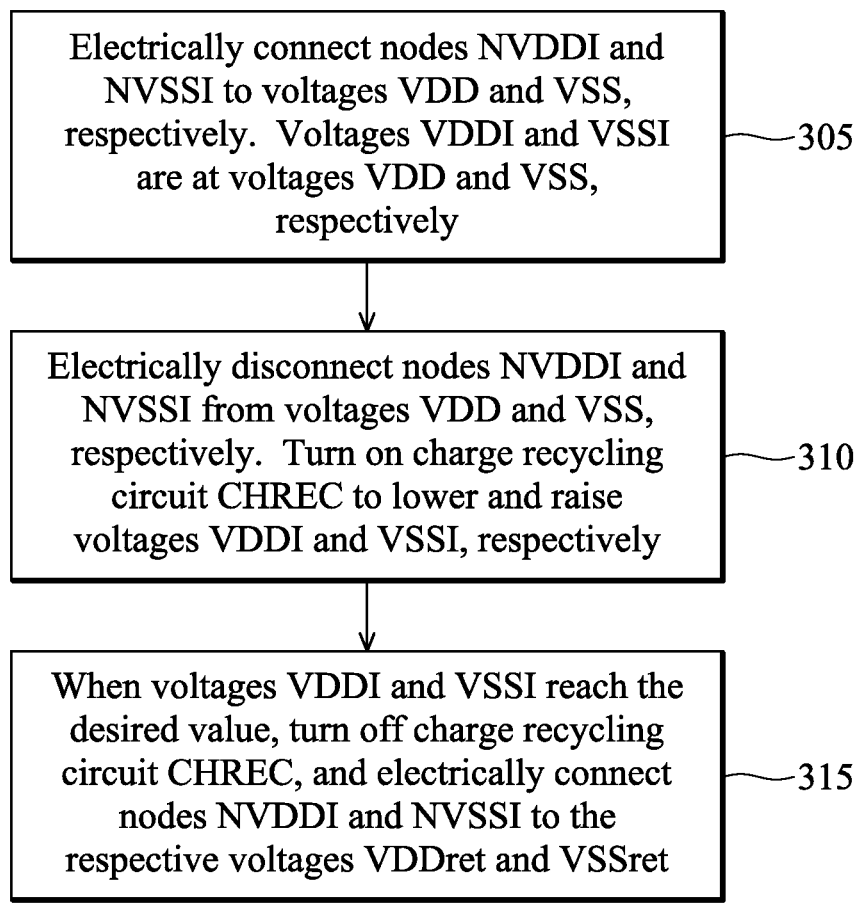
FIG. 3 is a flowchart illustrating an operation of the circuit in FIG. 1, in accordance with some embodiments.

FIG. 3 is a flowchart 300 illustrating a method of using circuit CHREC, in accordance with some embodiments. In this illustration, a memory cell MC transitions from the read mode to the data retention mode.

In step 305, memory cell MC is configured to be in the read mode. Transistors MZREP and MREN are turned on to electrically connect nodes NVDDI and NVSSI to the respective voltages VDD and VSS. Voltages VDDI and VSSI are at voltages VDD and VSS, respectively. At the same time, transistors MP2, MREP, and MZREN are turned off.

In step 310, memory cell MC is in the charge-recycling mode. Transistors MZREP and MREN are turned off to electrically disconnect nodes NVDDI and NVSSI from the respective voltages VDD and VSS. Voltages VDDI and VSSI at the respective nodes NVDDI and NVSSI, however, remain at voltages VDD and VSS. Transistor MP2 is also turned on to turn on the charge recycle circuit CHREC. As a result, voltages VDDI and VSSI at the level of voltages VDD and VSS begin to be lowered and raised, respectively.

In step 315, memory cell is in the data retention mode. When voltage VDDI and/or voltage VSSI reaches the desired value (e.g., voltage VDDI reaches voltage VDDret and/or voltage VSSI reaches voltage VSSret), transistor MP2 and thus circuit CHREC is turned off. Further, transistors MREP and ZREN are turned on to electrically connect nodes NVDDI and NVSSI to voltages VDDret and VDDret, respectively. Connecting nodes NVDDI and NVSSI to voltages VDDret and VSSret maintains nodes NVDDI and NVSSI at the respective data retention voltage levels VDDret and VSSret.

A number of embodiments have been described. It will nevertheless be understood that various modifications may be made without departing from the spirit and scope of the disclosure. For example, the various transistors being shown as a particular dopant type (e.g., NMOS (N-type Metal Oxide Silicon) and PMOS (P-type Metal Oxide Silicon)) are for illustration, embodiments of the disclosure are not limited to a particular type, but the dopant type selected for a particular transistor is a design choice and is within the scope of embodiments. The logic levels (e.g., Low or High) of the various signals used in the above description are also for illustration. Embodiments are not limited to a particular level when a signal is activated and/or deactivated, but, rather, selecting such a level is a matter of design choice. For example, transistor MP2 is shown as a PMOS and is controlled by signal ZRecycle being activated low. Transistor MP2, however, in some embodiments, is NMOS, and is controlled by a signal (e.g., signal Recycle, not labeled) being activated High.

The above method shows exemplary steps, but they are not necessarily performed in the order shown. Steps may be added, replaced, changed order, and/or eliminated as appropriate, in accordance with the spirit and scope of the disclosed embodiments.

Each claim of this document constitutes a separate embodiment, and embodiments that combine different claims and/or different embodiments are within scope of the disclosure and will be apparent to those of ordinary skill in the art after reviewing this disclosure.

What is claimed is:

1. A circuit comprising:
   a first node;
   a second node;
   a first p-type metal-oxide-semiconductor (PMOS) transistor having a source coupled to the first node, a drain coupled to a first control transistor, and a gate driven by a first set of one or more voltage sources; and
   a first n-type metal-oxide-semiconductor (NMOS) transistor having a source coupled to the second node, a drain coupled to the first control transistor and a gate driven by a second set of one or more voltage sources,
   wherein
   the first node voltage level is lowered while the second node voltage level is raised, if the first PMOS transistor, the first control transistor and the first NMOS transistor are on; and the first control transistor is controlled by a corresponding control voltage supply at a gate of the first control transistor.

2. The circuit of claim 1, further comprising:
a first power supply PMOS transistor coupled to a first supply voltage; and
a second power supply PMOS transistor coupled to a second supply voltage.

3. The circuit of claim 2, wherein a voltage level of the first supply voltage is greater than a voltage level of the second supply voltage.

4. The circuit of claim 2, wherein the first PMOS transistor is configured to maintain a voltage level at the first node equal to or greater than a voltage level of the second supply voltage.

5. The circuit of claim 1, further comprising:
a first reference supply NMOS transistor coupled to a first reference voltage; and
a second reference supply NMOS transistor coupled to a second reference voltage.

6. The circuit of claim 5, wherein a voltage level of the first reference voltage is less than a voltage level of the second reference voltage.

7. The circuit of claim 5, wherein the first NMOS transistor is configured to maintain a voltage level at the second node equal to or less than a voltage level of the second reference voltage.

8. A memory array comprising:
at least one column of memory cells, each column of the at least one column comprising:
a first node, and
a second node; and
a charge recycling circuit, the charge recycling circuit comprising:
a first p-type metal-oxide-semiconductor (PMOS) transistor having a source coupled to the first node, a drain coupled to a first control transistor, and a gate driven by a first set of one or more voltage sources; and
a first n-type metal-oxide-semiconductor (NMOS) transistor having a source coupled to the second node, a drain coupled to the first control transistor and a gate driven by a second set of one or more voltage sources, wherein
the first node voltage level is lowered while the second node voltage level is raised, if the first PMOS transistor, the first control transistor and the first NMOS transistor are on; and
the first control transistor is controlled by a corresponding control voltage supply at a gate of the first control transistor.

9. The memory array of claim 8, wherein the charge recycling circuit is connected to more than one of the at least one column.

10. The memory array of claim 8, wherein the charge recycling circuit is connected to each column of the at least one column.

11. The memory array of claim 8, wherein a voltage difference between the voltage level of the first node and the second node is equal to a first voltage difference, if the at least one column is in a read mode, and the voltage difference between the voltage level of the first node and the second node is equal to a second voltage difference, if the at least one column is in a write mode.

12. The memory array of claim 11, wherein the first voltage difference is greater than the second voltage difference.

13. The memory array of claim 8, wherein the at least one column further comprises:
a first power supply PMOS transistor coupled to a first supply voltage; and
a second power supply PMOS transistor coupled to a second supply voltage.

14. The memory array of claim 13, wherein a voltage level of the first supply voltage is greater than a voltage level of the second supply voltage.

15. The memory array of claim 13, wherein the first PMOS transistor is configured to maintain a voltage level at the first node equal to or greater than a voltage level of the second supply voltage.

16. The memory array of claim 8, wherein the at least one column further comprises:
a first reference supply NMOS transistor coupled to a first reference voltage; and
a second reference supply NMOS transistor coupled to a second reference voltage.

17. The memory array of claim 16, wherein a voltage level of the first reference voltage is less than a voltage level of the second reference voltage.

18. The memory array of claim 16, wherein the first NMOS transistor is configured to maintain a voltage level at the second node equal to or less than a voltage level of the second reference voltage.

19. A circuit comprising:
a first node;
a second node;
a first power supply p-type metal-oxide-semiconductor (PMOS) transistor coupled to a first supply voltage;
a second power supply PMOS transistor coupled to a second supply voltage;
a first reference supply n-type metal-oxide-semiconductor (NMOS) transistor coupled to a first reference voltage;
a second reference supply NMOS transistor coupled to a second reference voltage;
a first PMOS transistor having a source coupled to the first node configured to maintain a voltage level at the first node equal to or greater than a voltage level of the second supply voltage; and
a first NMOS transistor having a source coupled to the second node configured to maintain a voltage level at the second node equal to or less than a voltage level of the second reference voltage.

20. The circuit of claim 19, further comprising a control transistor electrically coupled between the first PMOS transistor and the first NMOS transistor,
wherein
the first node voltage level is lowered while the second node voltage level is raised, if the first PMOS transistor, the control transistor and the first NMOS transistor are on; and
the control transistor is controlled by a corresponding control voltage supply at a gate of the control transistor.

* * * * *